United States Patent [19]

Domnikov et al.

[11] Patent Number: 4,932,673

[45] Date of Patent: Jun. 12, 1990

[54] EMI SUPPRESSION GASKET FOR MILLIMETER WAVEGUIDES

[75] Inventors: Larissa Domnikov, Los Angeles; Theodore S. Fishkin; James A. Patrick, both of Lawndale; Gilbert Garcia, Westchester, all of Calif.

[73] Assignee: Hughes Aircraft Company, Los Angeles, Calif.

[21] Appl. No.: 150,600

[22] Filed: Feb. 1, 1988

[51] Int. Cl.[5] ........................ B65D 53/00; H01P 1/04; H05K 9/00

[52] U.S. Cl. .......................... 277/235 R; 174/35 GC; 277/901; 333/254; 439/271

[58] Field of Search ................... 277/227, 235 R, 901, 277/235 A; 174/35 R, 35 GC, 36; 285/910, 363, 368, 422; 333/254, 260, 248; 439/271, 920, 927

[56] References Cited

U.S. PATENT DOCUMENTS

| | | | |
|---|---|---|---|
| 695,174 | 3/1902 | Roller | 174/35 GC |
| 2,783,295 | 2/1957 | Ewing | 174/35 GC |
| 3,019,281 | 1/1962 | Hartwell | 277/901 X |
| 3,140,342 | 1/1964 | Ehrreich et al. | 277/235 R X |
| 3,167,322 | 1/1965 | Aichroth | 277/235 R X |
| 3,303,440 | 2/1967 | Meyer | 333/254 |
| 3,322,444 | 5/1967 | Sewell et al. | 333/254 X |
| 3,400,344 | 9/1968 | Booth | 333/254 |
| 3,467,398 | 9/1969 | Bernard | 277/235 R X |
| 3,500,264 | 3/1970 | Floyd, Jr. | 333/254 |
| 4,434,541 | 3/1984 | Powers, Jr. | 174/35 GC X |
| 4,529,257 | 7/1985 | Goodman et al. | 439/271 |

FOREIGN PATENT DOCUMENTS

| | | | |
|---|---|---|---|
| 883460 | 7/1953 | Fed. Rep. of Germany | 333/254 |
| 2827676 | 1/1979 | Fed. Rep. of Germany | 174/35 GC |
| 2537786 | 6/1984 | France | 333/254 |

OTHER PUBLICATIONS

"Waveguide Flange and EMI Sealing", Parker Seals, FIGS. 8 and 9, no date.

*Primary Examiner*—Harvey C. Hornsby
*Assistant Examiner*—Stephen F. Gerrity
*Attorney, Agent, or Firm*—Steven M. Mitchell; Robert A. Westerlund; Wanda K. Denson-Low

[57] ABSTRACT

A one-piece gasket is used between millimeter waveguide sections to prevent energy leakage from the joint. The gasket consists of an electrically conductive elastomeric ring filled with metallic particles, a conformable metallic inner shield on the inner periphery of the ring, and a conformable metallic outer shield on the outer periphery of the ring. The gasket is conveniently prepared by casting the filled elastomer in place between the shields.

13 Claims, 1 Drawing Sheet

EMI SUPPRESSION GASKET FOR MILLIMETER WAVEGUIDES

BACKGROUND OF THE INVENTION

This invention relates to millimeter waveguides, and, more particularly, to a gasket placed between two millimeter waveguide sections joined end to end.

Millimeter waves are electromagnetic waves having very short wavelengths, about 1 centimeter or less in wavelength, that transmit radio frequency energy. Millimeter waves are used in a variety of applications, including communications, where they can carry large amounts of information. Like radio waves, millimeter waves can either be beamed from place to place, or carried along a conductive path.

The conductive path used to carry millimeter waves is usually a waveguide. A conventional waveguide is a tube whose inside surface is coated with a conductive metal such as gold or silver. The microwaves travel along the inside of the tubular waveguide, which is usually cylindrical or rectangular in shape.

Waveguides are generally formed in sections for convenience or because of manufacturing or technical constraints. The sections must be joined together end-to-end when the final waveguide is assembled. To facilitate the joining, the waveguides are provided with flanges at the ends, and the flanges are bolted together.

A significant amount of the transmitted radio frequency energy can leak from unprotected joints between waveguide sections, particularly where the microwaves are of very short wavelengths on the order of 1 millimeter or less. When the waveguide is formed of a number of individual sections joined together, the loss of energy from the waveguide joints can be significant. The leakage of radio frequency energy interferes with, even to the point of overpowering, neighboring electronic devices (hence the leakage is termed EMI, or electromagnetic interference), and also cumulatively reduces the transmitted energy level. It is important to minimize the leakage at each joint between sections.

The prevention of leakage of radio frequency energy from the joints between millimeter waveguide sections is significantly more difficult than the corresponding problem for microwave waveguides, which have longer wavelengths of greater than 1 centimeter. The use of machining tolerances on the order of 0.001 inch on the flange faces, microwave gaskets, and choke flanges prevents leakage from microwave waveguide joints. These techniques have proved ineffective in preventing leakage from joints in millimeter waveguides, which are smaller in size than microwave waveguides. Because millimeter waves have shorter wavelengths, even tiny imperfections in the flanges and slight misalignments between waveguide sections can result in significant leakage of radio frequency energy. The prevention of energy loss from the joints between millimeter waveguide sections is recognized as a qualitatively different problem from that of prevention of energy loss from the joints between microwave sections.

There have been proposed several approaches for preventing leakage from the joints between millimeter waveguide sections. In one, a silver filled epoxy is forced into the joints and permitted to harden in place. This approach has the significant disadvantage of preventing easy disassembly of the sections and also contaminates the interior of the waveguide sections. In another approach, the gap between the waveguide sections is wrapped with a copper tape or foil that inhibits leakage. This method requires skilled technicians, is time consuming, requires specialized test equipment, is cumbersome, and is sometimes completely impractical, as where a waveguide section flange is joined to a flat surface.

It has also been proposed to use a hard gasket filled with conductive particles, which is placed between the flanges of the waveguide sections before bolting. Such gaskets have been used successfully between microwave waveguide sections, but are insufficiently effective in reducing energy leakage for short wavelength, high frequency millimeter waves.

There therefore exists a need for an improved approach for reducing leakage at the joint between millimeter waveguide sections that are joined end to end. The approach should be convenient and inexpensive to use, and should be effective in preventing leakage from the flanged joints of millimeter waveguides. The present invention fulfills this need, and further provides related advantages.

SUMMARY OF THE INVENTION

The present invention is embodied in an improved gasket that is readily fabricated and used in assembling millimeter waveguide sections. The gaskets are most readily fabricated with a procedure that is conducive to simultaneous production of multiple gaskets. The finished gaskets are only slightly more expensive to produce than conventional gaskets having inferior performance. The gasket is placed between the flanges of millimeter waveguide sections prior to assembly and compressed between the flanges as they are bolted together. The gasket reduces radio frequency leakage from waveguide joints for all millimeter wavelengths, and is especially effective in reducing leakage for the shortest wavelengths.

In accordance with the invention, a gasket for use in sealing the joint between two millimeter waveguides comprises an electrically conductive, conformable plate having an outer periphery and dimensioned to fit between the ends of two millimeter waveguides, and having a bore therethrough defining an inner periphery of the plate; an inner shield of a conformable metal joined to the inner periphery of the plate and extending between the waveguides; and an outer shield of a conformable metal joined to the outer periphery of the plate and extending between the waveguides. Since the flanges on the ends of the waveguide sections are normally circular, the flexible plate is normally a disk of sufficiently smaller diameter than the flanges so that the outer diameter of the outer shield is less than the diameter of the flanges.

In another embodiment, a gasket for sealing the joint between two pieces comprises an electrically conductive, flexible plate having a central bore therethrough; a metallic inner shield joined to the plate along the central bore and extending between the pieces; and a metallic outer shield joined to the plate along its outer periphery and extending between the pieces.

In yet another embodiment, a gasket comprises a disk formed of an elastomer filled with electrically conducting metallic particles and having a central bore therethrough; a metallic inner shield joined to the central bore of the disk; and a metallic outer shield joined to the periphery of the disk.

The gasket is formed of three parts. Its body is an electrically conducting conformable material formed in the appropriate shape. The body is typically a thin plate or disk slightly thicker than the space between the waveguide sections to be joined, if the waveguides are fixed, or of a convenient thickness if the waveguide sections are movable. The outer periphery of the body is ordinarily circular and of a diameter slightly less than the flange diameter of the waveguide sections. There is a bore through the thickness of the body that defines the inner periphery of the body. The bore is large enough to accommodate the end of the waveguide therein.

The body of the gasket is formed of a material that is resilient and deformable, so that it conforms to the gap between the flanges as they are forced together. As used herein, "conformable" means that a structure or element is deformable to adjust to the gap between the ends of the microwave sections as they are tightened together, without loss of essential structural integrity. The body must also be electrically conducting. The preferred construction is of an elastomer such as rubber, that is filled with particles of an electrically conductive material such as metal particles. The term "filled" means that the body has particles distributed throughout the volume of the elastomer. A filled elastomer is typically prepared by mixing the particles into a flowable elastomer and then permitting the elastomer to cure or harden to the desired shape.

Metallic shields are joined to the body along the inner periphery of the bore and also along the outer periphery. The shields are of an electrically conductive material, preferably a metal, that is conformable to the gap between the flanges as they are tightened together. Conformability of the metallic shields is preferably achieved by making the shields of thin pieces of metal that are ductile and crush axially as the flanges are tightened.

The preferred construction of the gasket is a ring made of silicone rubber filled with as high a content of small silver particles as possible. Using a combination of silver particles and flakes to maximize the packing, a volume fraction of about 60 percent or more of silver filling in the silicone rubber can be achieved. An inner shield of 1100 aluminum sheet is joined to the rubber on its inner periphery forming the bore therethrough. An outer shield of 1100 aluminum sheet is joined to the rubber on its outer periphery, which is slightly smaller than the diameter of the waveguide end flanges with which the gasket is to be used. The two shields extend the entire height of the ring, and preferably have a radial thickness of about 0.005 inches. There may be other through-thickness openings through the elastomeric body to accommodate the bolts that draw the flanges together and for alignment pins. The gasket is most readily fabricated by casting the filled elastomer into the space between the two shields, and permitting the elastomer to harden and bond to the shields.

In combination, the inner and outer shields together with the conductive elastomer prevent leakage of radio frequency energy from the interior of the millimeter waveguide through the gap between the flanges. As the gap between the flanges is reduced when the bolts are tightened, the filled elastomer and the shields conformably compress to fill all radial leakage paths, particularly those adjacent the faces of the flanges. Structural integrity of the elastomer and the shields is maintained, so that no new leakage paths are formed. A metallic conductive barrier is thereby formed to close and avoid virtually all possible radial leakage paths. This structure has been found to be particularly effective at preventing leakage of radio frequency microwaves in the millimeter range.

It will be appreciated that the gasket of the invention provides an important advance in the art of waveguides for millimeter microwaves. The gasket is highly effective in preventing loss or leakage of radio frequency energy at joints, permits easy assembly and disassembly of the joints, is easily installed, and is readily and inexpensively fabricated. Other features and advantages of the invention will be apparent from the following more detailed description of the preferred embodiment, taken in conjunction with the accompanying drawings, which illustrate, by way of example, principles of the invention.

DETAILED DESCRIPTION OF THE PREFERRED EMBODIMENT

Figure 1:
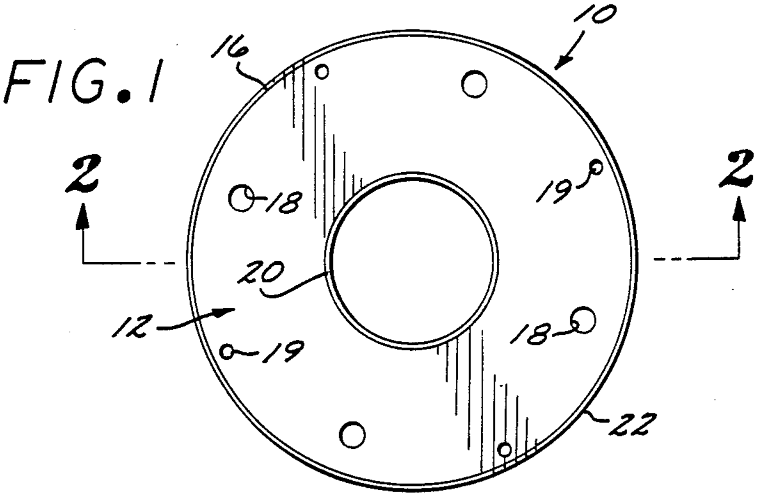
FIG. 1 is a plan view of the gasket.
Figure 2:
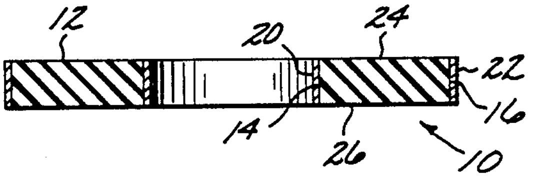
FIG. 2 is a side sectional view of the gasket, taken along line 2—2.

The present invention is embodied in a gasket 10, illustrated in FIGS. 1 and 2. The gasket includes a cylindrical disk 12 of filled silicone rubber, which is in the form of an annular plate in this preferred embodiment. A bore 14 extends through the disk 12 along its cylindrical axis, in the height direction, forming the inner periphery of the disk 12. The disk 12 has a cylindrical outer periphery 16. A pattern of bolt openings 18 through the ring 12 matches the bolt pattern of the flanges to be joined, and a pattern of pin openings 19 through the ring 12 matches the pattern of alignment pins in the flanges to be joined.

A metal inner shield 20 is joined to the disk 12 on its inner periphery, at the bore 14. A metal outer shield 22 is joined to the disk 12 on its outer periphery. Each of the shields 20 and 22 extends completely around the respective periphery to which it is joined, forming a full cylinder. Each of the shields 20 and 22 extends through the entire height of the disk 12 from a top surface 24 to a bottom surface 26 of the disk 12.

It will be appreciated that the rubber body of the gasket 10 can be of other shapes, as might be required for specific applications. In such other shapes, the inner shield and outer shield continue to provide conductive barriers as disclosed above.

The disk 12 is formed of an elastomeric material that is filled with electrically conductive particles. The elastomer is preferably a curable silicone rubber produced by the polymerization of a silane or a siloxane, such as dimethylsiloxane. Such rubbers are available commercially in a flowable form as a two-part mixture, resin and catalyst. After the two parts are mixed, the elastomer cures in about 16 hours at ambient temperature.

Other compliant materials can be used as the matrix of the disk, into which the electrically conductive filler is placed. Elastomers such as silicone rubber are the most suitable, as they are readily conformable to the surfaces against which they are pressed as the gasket is compressed. Other suitable elastomers include, but are not limited to, chloroprene (Neoprene), butadiene-acrylonitrile (Nitrile), and butadiene.

The electrically conductive filler is chosen with care to obtain a high volume fraction of filler, while maintaining integrity of the disk 12. In the preferred approach, silver in the form of powder and in the form of flakes is used as the filler. A combination of powder and flake forms is used to obtain a high packing density for the filler within the elastomer. If only a single size spherical powder particle is used, the volume fraction of filler is limited by the packing density of the spherical particles. The use of a mixture of small and large particles increases the packing density of the filler, and the use of a mixture of different size particles and flakes increases the packing density even further, achieving the highest volume fraction of filler in the rubber matrix.

The shields 20 and 22 are made of electrically conductive metal, preferably 1100 (nearly pure) aluminum. Other conformable metals such as gold, silver, copper and the like may also be used, but aluminum was selected as being highly conductive, inexpensive, and readily avilable. The shields need not be thick, and are preferably about 0.005 inches thick. 1100 aluminum foil of 0.005 inch thickness is available from a number of suppliers.

Gaskets 10 are most readily fabricated by a mass production technique. In this approach, there is provided a cylindrical mold having an inner wall corresponding to the location of the bore 14 and an outer wall corresponding to the location of the outer periphery 16.

Two sheets of 0.005 inch thick 1100 aluminum are formed into cylinders that fit snugly into the mold at the inner wall and the outer wall to become the inner shield 20 and the outer shield 22, respectively. The sheets are primed on the faying surfaces to be joined to the elastomer with an appropriate primer, such as Dow 4155, that promotes adhesion of the rubber to the metal by bonding both to the metal surface and to the rubber.

A filler mixture is formed of about 7+/−0.1 parts by weight of Handy & Harmon Formula 222 pure silver powder and about 1+/−0.1 parts by weight of Handy & Harmon Formula 135 pure silver flakes. An elastomer mixture of General Electric G615 elastomer is formed by mixing together 10 parts by weight resin and 1 part by weight catalyst. A matrix mixture is formed by mixing together 1 part by weight of the elastomer mixture with 2.75+/−0.05 parts by weight of the filler mixture. The matrix mixture, which has a consistency like that of toothpaste, is placed into a vacuum and vibrated violently for 30 minutes at a rate of 15 Hertz and amplitude of ½ inch, to eliminate porosity. The mixture is poured into the mold and cast in place against the shields 20 and 22. The elastomer mixture is allowed to cure for about 16 hours at ambient temperature, followed by post curing of 2 hours at a temperature of 225° C. The mold is disassembled to reveal a "log" of filled elastomer with layers of aluminum on the inner periphery and outer periphery. The log is precision sectioned perpendicular to its cylindrical axis to form a group of gasket preforms. The gaskets 10 are completed by punching or drilling holes 18 and 19 in the required pattern for the bolt openings 18 and alignment pin openings 19.

The dimensions of the gaskets vary depending upon the dimensions and configuration of the waveguides to be joined. In one example presented as illustrative of the general dimensions involved, for use with millimeter waveguides in the range WR19 to WR28, a gasket is an annulus with a bore or inner periphery diameter of 0.500 inches, an outer periphery diameter of 1.125 inches, and a thickness or height of 0.060 inches. Such a gasket has a four-bolt pattern of openings 18 and a four hole pattern of openings 19 for alignment pins in the flanges. The volume resistance of the filled elastomer forming the disk 12 is 0.7 milliohms, as measured by the surface probe method of MIL-G-G83528, paragraph 4.6.11.

Figure 3:
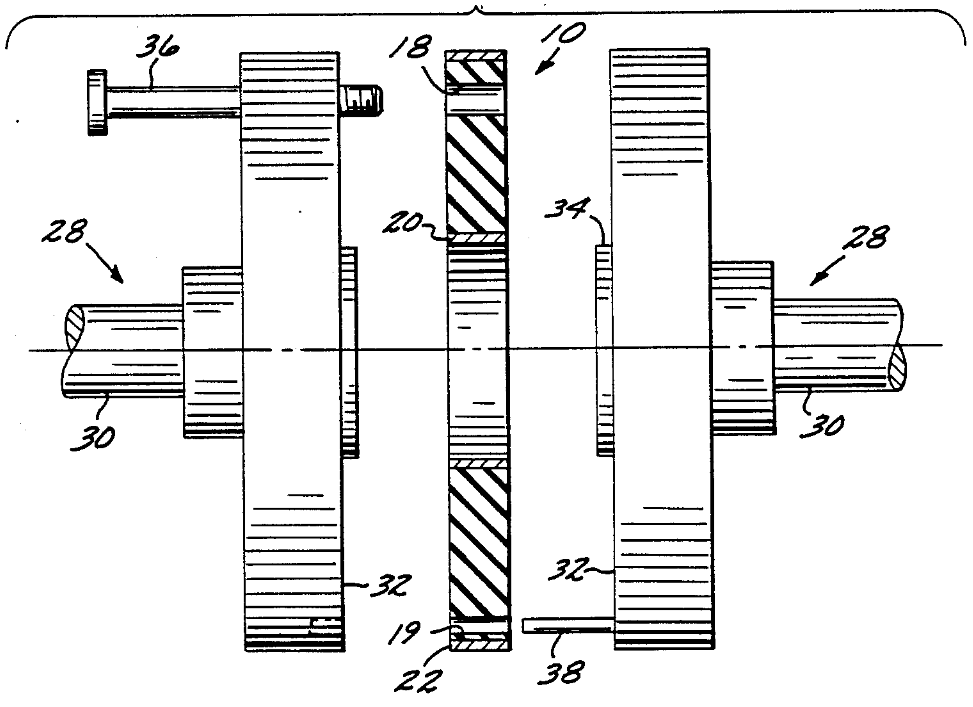
FIG. 3 is an elevational exploded view of the joint between two waveguide sections, with the gasket therebetween shown in section.

FIG. 3 illustrates the manner of use of the gasket 10 and its assembly into a structure. The gasket 10 is assembled between two sections 28 of millimeter waveguide. Each section 28 includes a tubular body 30 and an enlarged flange 32 at the locations to be joined end to end. A portion 34 of each section 28 extends beyond the face of the flange 32.

The gasket 10 is placed between the flanges 32, and the flanges 32 are aligned with a set of alignment pins 38 extending from one of the flanges to engage the other of the flanges. After being aligned, the flanges 32 are then compressed together with a series of bolts 36 that are progressively tightened. The gasket 10 is compressed parallel to its height, along the cylindrical axis, against the opposing faces of the flanges 32. The conformable elements of the gasket 10 are compliantly compressed by the flanges 32, so that they are tightly pressed against the flange faces. The filled disk 12 is resiliently pressed against the flange faces, and the shields 20 and 22 are also compressed. Because the inner shield 20 is captured between the extending portion 34 and the ring 12, it tends to crumple and bow inwardly against the extending portion 34, thereby forming a continuous shield to prevent microwave leakage. The outer shield 22 also tends to crumple slightly against the faces of the flanges 32, and also to bow outwardly, although the outer shield 22 is less tightly constrained than the inner shield 20.

The gasket provides three radial conductive barriers to the leakage of radio frequency energy, the inner shield 20, the filled conductive disk 12, and the outer shield 22. The disk 12 is the primary barrier to leakage, as it is electrically conductive and its elastomer construction conforms to the surfaces of the flanges 32, even if they are slightly misaligned. The soft elastomer, conformable disk is superior to hard, inflexible gaskets previously used in microwave waveguides. It is found that each barrier by itself permits some leakage, but that the three together are highly effective in preventing leakage of energy.

Leakage from a joint was determined at a millimeter wavelength of about 1 millimeter. A Gunn oscillator was attached to one end of a waveguide section 28. With the other end sealed with copper tape, the energy loss was −80 dBm (decibels, relative to a milliwatt). This loss level is the system noise floor attributable to leakage from the oscillator, and below which measurement was not possible. A second section 28 was joined to the first section without a gasket in place, and the energy loss was measured to be −50 to −60 dBm. The gasket of the invention was installed into the joint between the two sections 28, and the energy loss was measured to be −80 dBm. That is, there was essentially no measurable radio frequency energy loss from the joint above the system noise floor. The gasket of the invention is seen to be highly effective in preventing radio frequency leakage and energy loss from joints, even for high frequency, short wavelength millimeter waves.

The gasket of the invention is easy to fabricate and use, eliminating the need for tapes and the like to insulate against radio frequency leakage from millimeter waveguides. The gasket can be used where tape is impossible or impractical to use, permits the joint between waveguide sections to be readily assembled and disassembled, and does not contaminate the interior of the waveguide. Although a particular embodiment of the invention has been described in detail for purposes of illustration, various modifications may be made without departing from the spirit and scope of the invention. Accordingly, the invention is not to be limited except as by the appended claims.

What is claimed is:

1. A gasket for use in sealing a joint between two millimeter waveguides, each waveguide having an end disposed in an abutting relation to an end of the other waveguide, comprising:

an electrically conductive, conformable plate having an outer periphery and dimensioned to fit between and contact the ends of the two millimeter waveguides, and having a bore therethrough defining an inner periphery of the plate;

an inner shield of a conformable metal sheet through which millimeter waves are not permitted to pass, joined to the inner periphery of the plate and extending between the waveguides; and an outer shield of a conformable metal sheet through which millimeter waves are not permitted to pass, joined to the outer periphery of the plate and extending between the waveguides.

2. The gasket of claim 1, wherein said inner shield and said outer shield are formed of a metal selected from the group consisting of aluminum, silver, gold, and copper.

3. The gasket of claim 1, wherein said plate is formed of an electrically conductive elastomer.

4. The gasket of claim 1, wherein said plate is formed of rubber filled with electrically conductive metallic particles.

5. The gasket of claim 4, wherein the particles are a mixture of powders and flakes.

6. The gasket of claim 4, wherein the volume fraction of metallic particles in said plate is at least about 60 percent.

7. The gasket of claim 1, wherein the thickness of said inner shield is about 0.005 inches.

8. The gasket of claim 1, wherein the thickness of said outer shield is about 0.005 inches.

9. A gasket for sealing a joint between two pieces, comprising:

an electrically conductive, flexible plate having a central bore therethrough and an outer periphery;

a metallic inner shield through which short wavelength energy is not permitted to pass, joined to the plate along the central bore and extending between the pieces; and a metallic outer shield through which short wavelength energy is not permitted to pass, joined to the plate along its outer periphery and extending between the pieces.

10. The gasket of claim 9, wherein said inner shield and said outer shield are formed of a metal selected from the group consisting of aluminum, silver, gold, and copper.

11. The gasket of claim 9, wherein said plate is formed of an electrically conductive elastomer.

12. The gasket of claim 9, wherein said plate is formed of rubber filled with electrically conductive metal particles.

13. The gasket of claim 9, wherein said plate has the shape of a disk.

* * * * *